(12) United States Patent
Sugimoto et al.

(10) Patent No.: US 6,781,210 B2
(45) Date of Patent: Aug. 24, 2004

(54) SOLID-STATE IMAGING DEVICE AND MANUFACTURING METHOD THEREOF AND SEMICONDUCTOR DEVICE MANUFACTURING METHOD

(75) Inventors: Dai Sugimoto, Kanagawa (JP); Takeshi Matsuda, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/917,681

(22) Filed: Jul. 31, 2001

(65) Prior Publication Data

US 2002/0027258 A1 Mar. 7, 2002

Related U.S. Application Data

(62) Division of application No. 09/166,901, filed on Oct. 6, 1998, now Pat. No. 6,281,034.

(30) Foreign Application Priority Data

Oct. 6, 1997 (JP) ............................................ P9-272847

(51) Int. Cl.[7] ............................................. H01L 31/02
(52) U.S. Cl. ...................................... 257/435; 257/294
(58) Field of Search ................................. 257/294, 435

(56) References Cited

U.S. PATENT DOCUMENTS

| | | | | |
|---|---|---|---|---|
| 5,523,609 A | * | 6/1996 | Fukusho | 257/435 |
| 5,621,461 A | * | 4/1997 | Higashide | 257/232 |
| 5,773,859 A | * | 6/1998 | Ueno | 257/291 |

\* cited by examiner

*Primary Examiner*—Jerome Jackson
(74) *Attorney, Agent, or Firm*—Rader, Fishman & Grauer PLLC; Ronald P. Kananen

(57) ABSTRACT

A solid-state imaging device is able to prevent a sensitivity from being lowered and to suppress a smear caused as a pixel size is reduced and to provide an excellent image quality even though it is miniaturized and a manufacturing method thereof is proposed.

Also, a method of manufacturing a semiconductor device is able to form a conductive layer having an excellent adhesion with an underlayer and whose surface has an excellent flatness in the process for forming a metal interconnection and the process for burying a contact-hole. A solid-state imaging device (20) includes a light-shielding film (6) of a two layer structure comprising a first film (11) formed of a film deposited by a sputtering or vapor deposition and a second film (12) formed of a tungsten film deposited by a chemical vapor deposition.

10 Claims, 4 Drawing Sheets

SOLID-STATE IMAGING DEVICE AND MANUFACTURING METHOD THEREOF AND SEMICONDUCTOR DEVICE MANUFACTURING METHOD

Divisional of prior application Ser. No. 09/166,901 filed Oct. 06, 1996 now U.S. Pat. No. 6,216,034.

BACKGROUND OF THE INVENTION

The present invention relates to a solid-state imaging device such as a CCD (charge-coupled device) solid-state imaging device or the like and a manufacturing method thereof and a semiconductor device manufacturing method such as a process for forming a metal interconnection, a process for burying a contact-hole or the like.

Generally, in solid-state imaging devices, after electrical components such as charge-transfer regions, channel-stop regions, photo-sensor regions, gate electrodes and so on were formed, a metal film for preventing light from becoming incident on other regions than a photo-sensor region is formed as a light-shielding film.

In conventional solid-state imaging devices, metal thin films such as aluminum, tungsten, tungsten silicide and so on deposited by sputtering have heretofore been used as the light-shielding film. The light-shielding film that was deposited by sputtering is processed by photo-etching to selectively remove the above-mentioned photo-sensor portion only, thereby resulting in pixels of the solid-state imaging device being formed.

However, if the above-mentioned light-shielding film has a poor light-shielding characteristic, i.e. light passes other regions than the photo-sensor region, then light becomes incident on a so-called optical black portion or a phenomenon called a smear in which light is leaked into a charge transfer portion occurs.

If the light-shielding film is thick, then it becomes difficult to process the light-shielding film by microminiaturization or a dark current in the device increases and a point defect increases due to damages caused on the underlayer upon dry etching.

Moreover, if the light-shielding film cannot be reduced in thickness as a size of a pixel is reduced, then a length from an on-chip micro lens to the surface of the photo-sensor increases to lower a lens focusing efficiency of the on-chip micro lens and to thereby lower a photo-sensor sensitivity.

On the other hand, the metal film deposited by sputtering is poor in step coverage and an effective film thickness of a side wall of a step is reduced so that light passes the metal film. Therefore, the film thickness of the metal film cannot be reduced so much. In particular, a leakage of light into the aluminum thin film from a grain boundary is remarkable, and hence the film thickness of the aluminum thin film cannot be decreased up to less than 400 nm.

Since the metal thin film, in particular, the tungsten thin film deposited by a CVD (chemical vapor deposition) which is widely used in the manufacturing process of semiconductors has a considerably satisfactory step coverage in principle, the tungsten film is very effective as the light-shielding film for solid-state imaging devices. However, the tungsten film cannot be directly deposited on a silicon oxide film and is extremely low in adhesion so that an adhesion layer is indispensable for the tungsten film when the tungsten film is deposited on the silicon oxide film. As the adhesion layer, there has hitherto been used a titanium nitride film.

However, since a titanium system material such as a TiN (titanium nitride) film has a function to adsorb hydrogen, the supply of hydrogen from an upper layer to reduce an interface state density of a substrate surface is hindered and the interface state density remains, thereby resulting in a dark current being increased.

Therefore, the titanium material is not suitable as the material of the light-shielding film of the solid-state imaging device.

Since the size of a pixel in a CCD is reduced as a camera is miniaturized recently, there is an increasing demand for a light-shielding film which is strong against the transmission of light and which may be reduced in thickness.

SUMMARY OF THE INVENTION

In view of the aforesaid aspect, it is an object of the present invention to provide a solid-state imaging device and a manufacturing method thereof in which a sensitivity may be prevented from being lowered and a smear may be suppressed as a pixel size is reduced and in which an excellent image quality may be obtained even though the solid-state imaging device is miniaturized.

It is another object of the present invention to provide a method of manufacturing a semiconductor device in which a conductive layer having an excellent adhesion with an underlayer and whose surface has an excellent flatness is formed in the process for forming a metal interconnection and the process for burying a contact-hole.

According to a first aspect of the present invention, there is provided a solid-state imaging device having a light-receiving portion formed on a semiconductor substrate and a light-shielding film formed so as to cover an electrode formed on the semiconductor substrate at least on its regions other than a region above the light-receiving portion. This solid-state imaging device is arranged such that the light-shielding film has a multilayer structure including a first film formed of a film deposited by sputtering or vapor deposition and a second film deposited by chemical vapor deposition.

According to a second aspect of the present invention, there is provided a method of manufacturing a solid-state imaging device which comprises the steps of forming a light-receiving portion on a semiconductor substrate, forming an electrode on the semiconductor substrate at least on its regions other than a region above the light-receiving portion, forming an insulating film on the electrode, and forming a light-shielding film so as to cover the insulating film, wherein the light-shielding film is formed in such a manner that, after a first film is formed by sputtering or vapor deposition, a second film is formed on the first film by chemical vapor deposition.

According to a third aspect of the present invention, there is provided a method of manufacturing a semiconductor device which comprises the steps of forming a first film on the surface of a substrate by sputtering or vapor deposition, removing a native oxide from the surface of the first film, forming a second film on the first film by chemical vapor deposition, and forming a conductive film of a mulitlayer film including the first film and the second film.

According to the solid-state imaging device of the present invention, since the first film is formed of the film deposited by sputtering or vapor deposition, the first film has an excellent adhesion with the underlayer. Also, since the second film formed of the tungsten film deposited by chemical vapor deposition is formed on the first film, the second film is formed with an excellent adhesion through the first film, and a sufficient light-shielding property may be maintained by the second film.

According to the method of manufacturing a solid-state imaging device of the present invention, since the first film is formed of the film deposited by sputtering or vapor deposition, the first film is deposited with an excellent adhesion with the underlayer. Also, since the second film formed of the tungsten film is formed on the first film, the second film is formed with an excellent adhesion through the first film. Also, since the second film is deposited by chemical vapor deposition, a step coverage is satisfactory and a leakage of light from a step side wall or the like may be prevented, thereby making is possible to maintain a sufficient light-shielding property.

According to the method of manufacturing a semiconductor device of the present invention, after the first film was formed, the natural oxide is removed from the surface of the first film and then the second film is formed. Thus, the surface of the first film may be made flat, and the surface of the second film also may be formed satisfactorily.

DESCRIPTION OF THE PREFERRED EMBODIMENTS

Prior to the description of the preferred embodiments of the present invention, a fundamental principle of the present invention will be described below.

According to the present invention, there is provided a solid-state imaging device having a light-receiving portion formed on a semiconductor substrate and a light-shielding film formed so as to cover an electrode formed on the semiconductor substrate at least on its regions other than a region above the light-receiving portion. This solid-state imaging device is characterized in that the light-shielding film has a mulitlayer structure including a first film formed of a film deposited by sputtering or vapor deposition and a second film deposited by chemical vapor deposition.

According to the present invention, there is provided a method of manufacturing a solid-state imaging device which comprises the steps of forming a light-receiving portion on a semiconductor substrate, forming an electrode on the semiconductor substrate at least on its regions other than a region above the light-receiving portion, forming an insulating film on the electrode, and forming a light-receiving portion so as to cover the insulating film, wherein the light-shielding film is formed in such a manner that, after a first film is formed by sputtering or vapor deposition, a second film is formed on the first film by chemical vapor deposition.

According to the present invention, there is provided a method of manufacturing a semiconductor device which comprises the steps of forming a first film on the surface of a substrate by sputtering or vapor deposition, removing a natural oxide from the surface of the first film, forming a second film on the first film by chemical vapor deposition, and forming a conductive film of a multilayer film including the first film and the second film.

A solid-state imaging device according to an embodiment of the present invention and a manufacturing method thereof will now be described with reference to the drawings.

Figure 1:
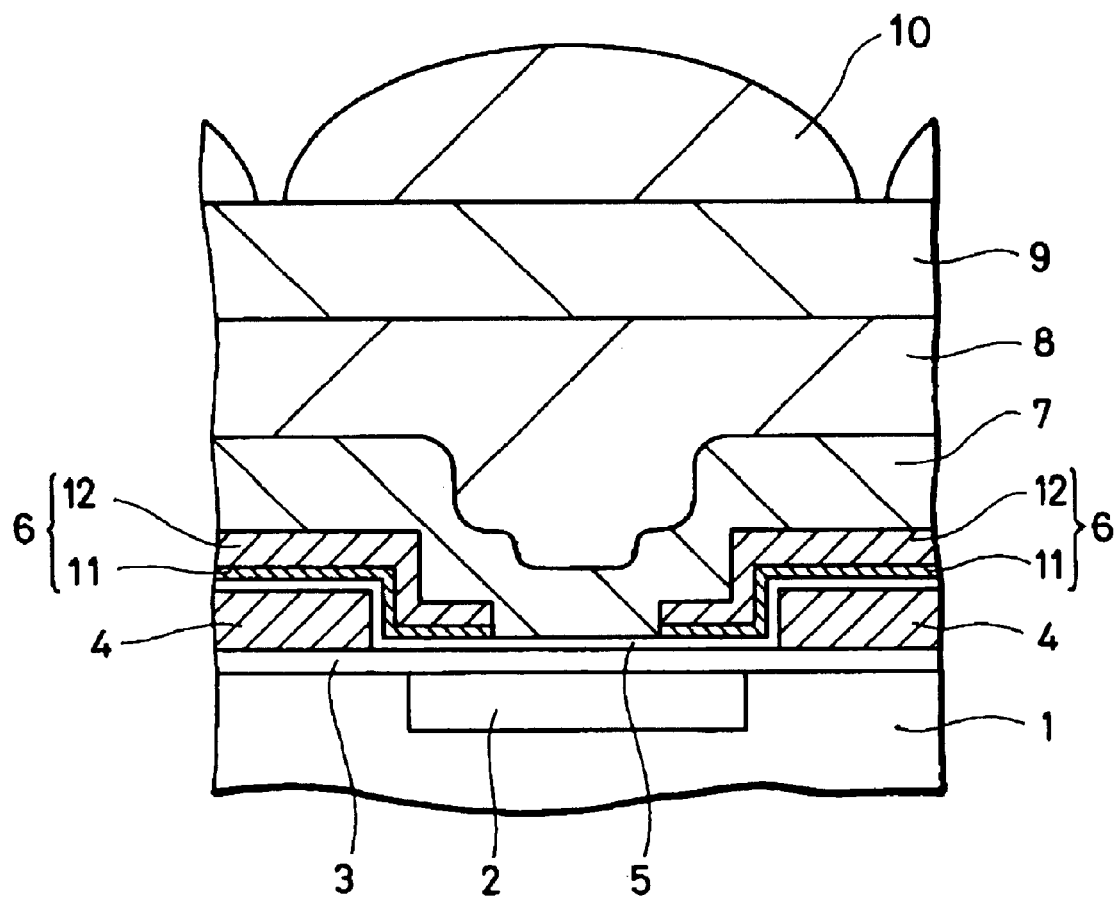
FIG. 1 is a cross-sectional view schematically showing a solid-state imaging device according to an embodiment of the present invention.

FIG. 1 of the accompanying drawings is a cross-sectional view schematically showing a solid-state imaging device 20 which is a device corresponding to one pixel.

In the solid-state imaging device 20, a photo-sensor (light-receiving portion) 2 is formed within a semiconductor substrate 1, and a transfer electrode 4 is formed on the semiconductor substrate 1 at its area other than the area in which the light-receiving portion 2 is formed through a gate insulating film 3. A light-shielding film 6 is formed on the transfer electrode 4 through an interlayer insulating film 5, and this light-shielding film 6 is able to prevent light from becoming incident on the transfer electrode 4. The light-shielding film 6 has an opening defined on the light-receiving portion 2 to allow light to become incident on the light-receiving portion 2.

An interlayer insulating film 7 is formed over the whole surface of the light-shielding film 6. A planarization film 8 is formed on the whole surface of this interlayer insulating film 7, and the upper surface of the planarization film 8 is made flat.

Further, a color filter 9 is formed on the planarization film 8, and an on-chip micro-lens 10 is formed on the color filter 9.

Then, in this embodiment, a first film 11 formed of a tungsten film deposited by sputtering (hereinafter referred to as an SP-W film), in particular, is formed as an adhesion film. Then, a second film 12 formed of a tungsten film deposited by a CVD (chemical vapor deposition) (hereinafter referred to as a CVD-W film) is formed on the first film 11. A two layer structure comprising the first and second films 11 and 12 is used as the light-shielding film 6.

According to this embodiment, since the second film 12 composed of the CVD-W film is formed on the first film 11, the step coverage is satisfactory and the light-shielding film 6 may be made sufficiently thick even in the side wall of the step, thereby making it possible to suppress light from passing the light-shielding film 6 satisfactorily.

Further, since the first film 11 composed of the SP-W film is formed as the adhesion layer, the light-shielding film 6 has a satisfactory adhesion with the underlayer such as the interlayer insulating film 5.

Furthermore, since the first film 11 is unable to adsorb hydrogen, hydrogen is supplied from the interlayer insulating layer 8 of the upper layer or the like to the surface of the semiconductor substrate 1 to reduce an interface state of the substrate surface, thereby making it possible to reduce a dark current in the solid-state imaging device.

Accordingly, without the increase of light passing the light-shielding film 6 and the increase of the dark current in the solid-state imaging device, the light-shielding film 6 may be reduced in thickness. Thus, it is possible to prevent a sensitivity from being lowered and to prevent a smear from increasing as the size of pixel is reduced.

Further, since the light-shielding film 6 may be reduced in thickness as described above, an accuracy in the microminiaturization process may be increased, thereby making it possible to prevent an image quality from being deteriorated as a sensitivity becomes fluctuated.

Furthermore, since the thickness of the light-shielding film 6 is reduced, a damage caused on the underlayer upon dry etching may be decreased, thereby making it possible to reduce the dark current and the point defect, both of which are caused by the above-mentioned damage.

This solid-state imaging device 20 will be manufactured as follows.

Figure 2A:
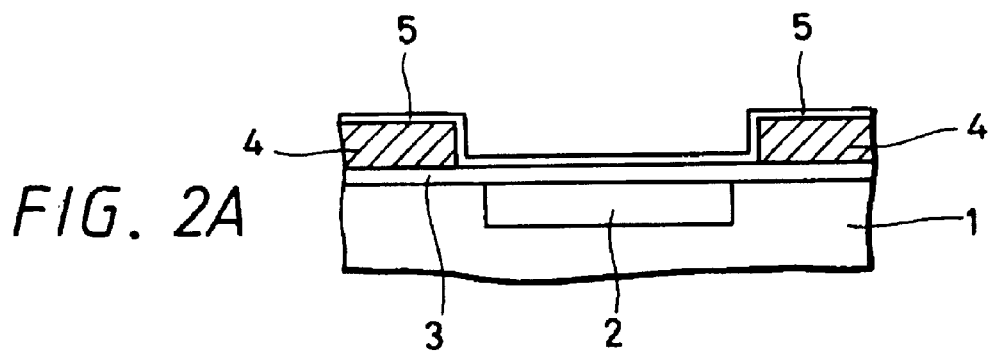
FIGS. 2A to 2G are manufacturing process diagrams of the solid-state imaging device shown in FIG. 1.

Initially, as shown in FIG. 2A, a light-receiving portion (photo-sensor) 2 of a CCD solid-state imaging device, a charge transfer region and a channel stop region (not shown) are formed on a silicon wafer 1 by a known method. Then, a transfer electrode 4 is formed on the charge transfer region of the silicon wafer 1 through a gate insulating film 3, and an interlayer insulating film 5 is formed on the whole surface of the gate insulating film 3.

Figure 2B:
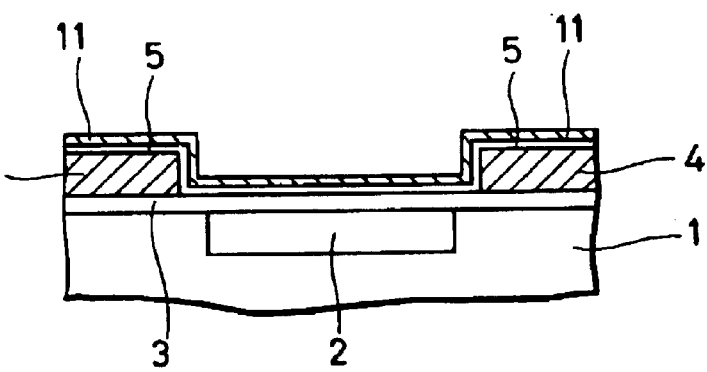

Then, as shown in FIG. 2B, a tungsten film having a thickness of 20 to 100 nm is deposited by sputtering to form a first film 11 formed of an SP-W film. The film thickness of the first film 11 formed of this SP-W film is selected to be such that it should not be peeled off from the underlayer and that a film thickness in a coverage deepest portion (near the portion in which an opening of the light-receiving portion 2 is formed later; this coverage deepest portion tends to become thinner than other portions) may form an adhesion layer of the second film 12 formed of the next CVD-W film. The film thickness of the first film 11 should preferably be made as thin as possible.

The sputtering conditions are such that an Ar (argon) gas pressure is 4 mTorr and a DC output is 2 kW.

Then, preferably, after the first film 11 composed of the SP-W film was deposited, a natural oxide that was formed on the surface of the first film 11 is removed when the deposition apparatus is exchanged.

The natural oxide may be removed by hydrogen plasma treatment, for example. The conditions of the hydrogen plasma treatment are such that a hydrogen gas pressure is 4.5 Torr, an RF output is 200 W and a treatment temperature is 450° C.

When the natural oxide is removed, the unevenness caused on the surface of the first film 11 due to oxidation may be made flat.

Thus, the adhesion of the second film 12 formed on the first film 11 may be increased, and the surface of the second film 12 may be formed with a satisfactory flatness.

Incidentally, if the surface of the second film 12, i.e. the surface of the light-shielding film 6 is rough, then incident light is irregularly reflected on such rough surface so that a light-receiving amount of each pixel is fluctuated, thereby resulting in a fluctuating sensitivity.

Figure 2C:
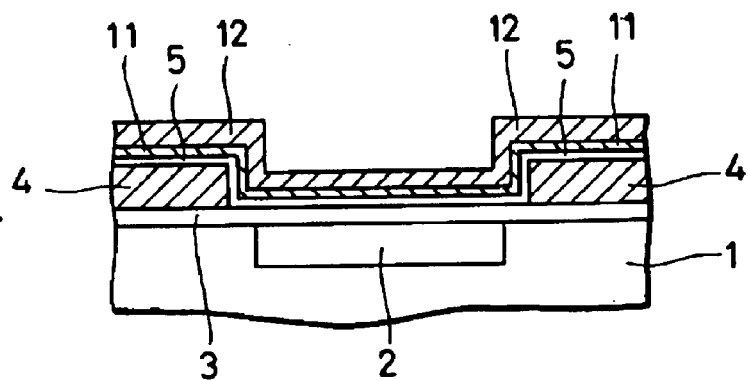

Then, with a CVD apparatus, tungsten is deposited on the first film 11 formed of the SP-W film to form a second film 12 by using $WF_6$ as a raw material gas as shown in FIG. 2C.

The film thickness of the second film 12 is selected in a range of from about 80 nm to 200 nm so as to maintain a satisfactory light-shielding property.

The CVD conditions are selected such that a flow rate between $WF_6$ and the hydrogen gas is 1:100, a gas pressure is 80 Torr and a temperature is 450° C.

Figure 2D:
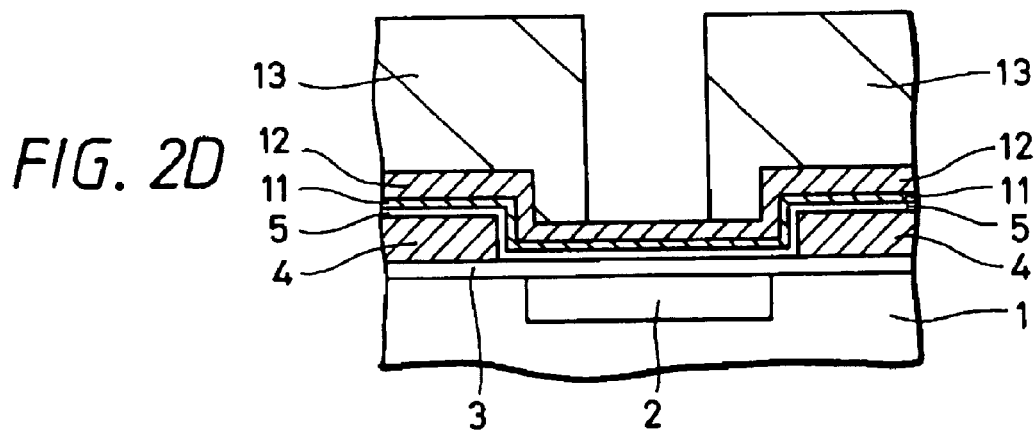
Figure 2E:
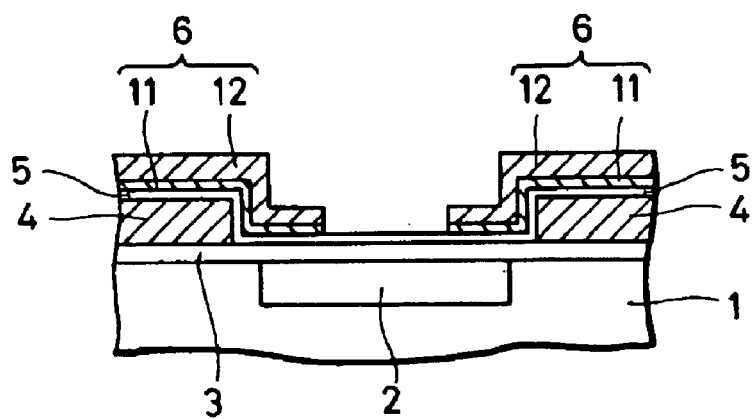

Then, as shown in FIG. 2D, a photoresist 13 is coated on the light-shielding film 6 of the two layer structure comprising the tungsten films 11, 12, and the light-shielding film 6 is selectively removed by etching using this photoresist 13 as a mask, thereby resulting in an opening of the photo-sensor 2 being formed in the light-shielding film 6. Thereafter, the photoresist 13 is removed as shown in FIG. 2E.

Then, an interconnection (not shown) of circuit portions around the solid-state imaging device is formed by aluminum.

Figure 2F:
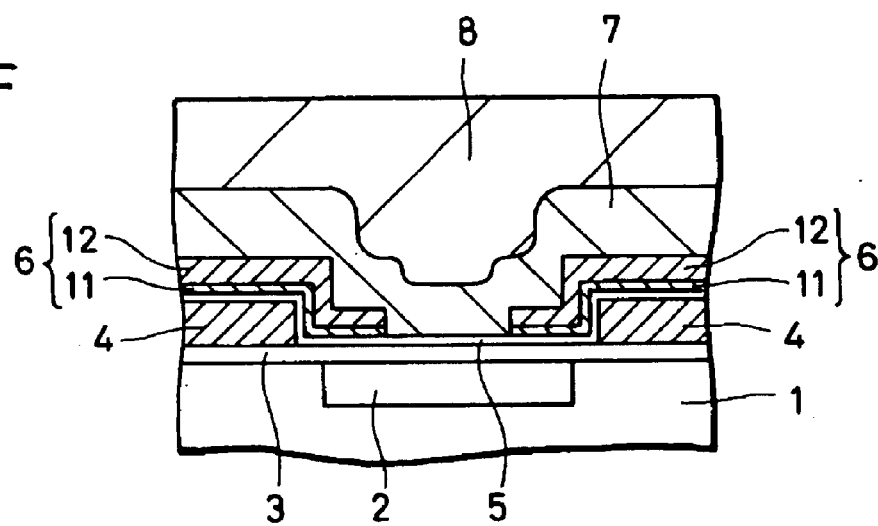

Next, as shown in FIG. 2F, a silicon nitride film is formed as an interlayer insulating layer 7 by a plasma CVD, and a resin of a planarization layer 8 is coated on the whole surface of the interlayer insulating layer 7.

Figure 2G:
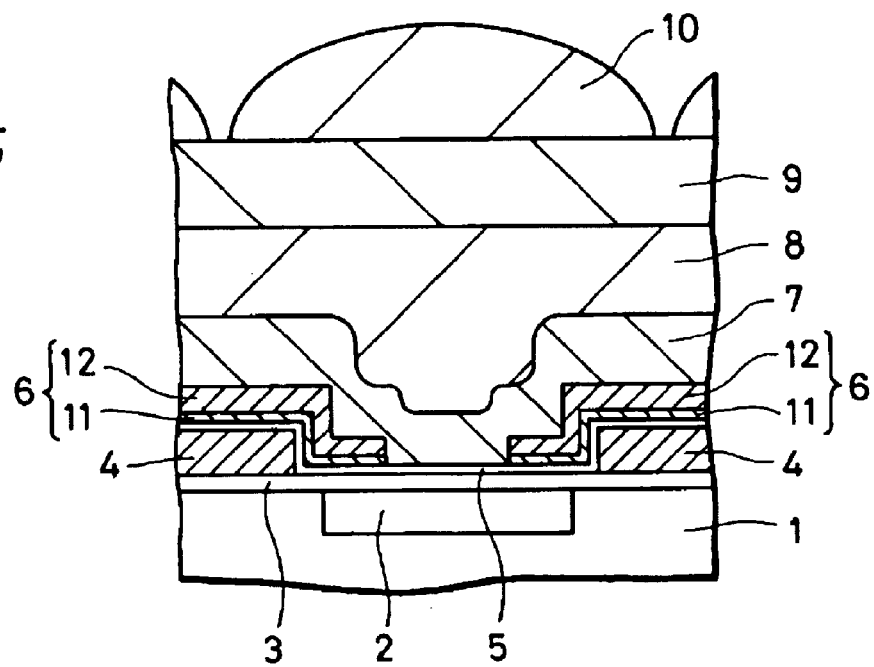

Further, as shown in FIG. 2G, by a known method, a color filter 9 and an on-chip micro lens 10 are formed in that order, thereby resulting in a solid-state imaging device 20 being completed.

According to this embodiment, since the light-shielding film 6 has the two layer structure comprising the first film 11 formed of the SP-W film and the second film 12 formed of the CVD-W film, the CVD-W film may provide a satisfactory step coverage property. Also, since the light-shielding film 6 has the two layer structure, the light-shielding film 6 may prevent light from being leaked from the grain boundary, and hence the film thickness of the light-shielding film 6 may be reduced to less than 200 nm, e.g. approximately 100 nm.

While the first film 11 was formed of the tungsten film deposited by the sputtering (SP-W film) as described above, the present invention is not limited thereto, and the first film 11 may be formed of other films that may be formed by sputtering.

Moreover, the first film 11 may be formed by other suitable materials such as aluminum, gold and so on deposited by a vapor deposition instead of sputtering.

As the material of the first film 11 formed by sputtering or vapor deposition, there may be enumerated, in addition to tungsten, metal such as aluminum, gold, chromium or the like and metal silicide such as molybdenum silicide, tungsten silicide or the like.

Even though the first film 11 is formed by any of these materials, the first film 11 is unable to adsorb hydrogen unlike the titanium material. Thus, it is possible to reduce the interface state by supplying hydrogen from the interlayer insulating film 7 of the upper layer or the like to the surface of the semiconductor substrate 1.

While the natural oxide on the surface of the SP-W film was removed by the hydrogen plasma before the CVD-W film is deposited as described above, the present invention is not limited thereto, and the following variant also is possible. That is, the SP-W film and the CVD-W film are deposited within the same apparatus and continuously deposited in the vacuum atmosphere, thereby achieving similar effects in which the surface of the SP-W film may be made flat and the CVD-W film may be formed on the SP-W film with the excellent flatness.

While the present invention is applied to the solid-state imaging device and the manufacturing method thereof as described above, the present invention is not limited thereto, and may be similarly applied to the manufacturing of ordinary semiconductor devices.

In the conductive layer forming process such as a process for forming an interconnection layer and a process for burying a contact hole between upper and lower interconnections in the multilayer interconnection, initially, a first film is formed by the sputtering or vapor deposition. Thus, an adhesion between the interconnection layer or the contact buried layer and the underlayer becomes satisfactory.

Subsequently, a natural oxide formed on the surface of the first films is removed, whereby the surface of the first film is made flat. Thus, the flatness of the surface of an interconnection layer or the contact buried layer is formed of the subsequent second film becomes satisfactory. As a result, the interconnection layer or the contact layer buried layer is formed of the two layer structure comprising the first film and the second film.

In the case of the contact buried layer, after a buried material is formed on the whole surface including the inside of the contact hole, a material formed on other portions than the contact hole is removed by etch back.

At that time, when the surface of the buried material layer is rough, an unwanted buried material is removed by etch back with reference to the highest position of the coarse portion so that a removal amount of an unwanted material by etch back is unavoidably increases or the side wall of contact hole obtained after etch back is unnecessarily etched away by over-etching.

Figure 3A:
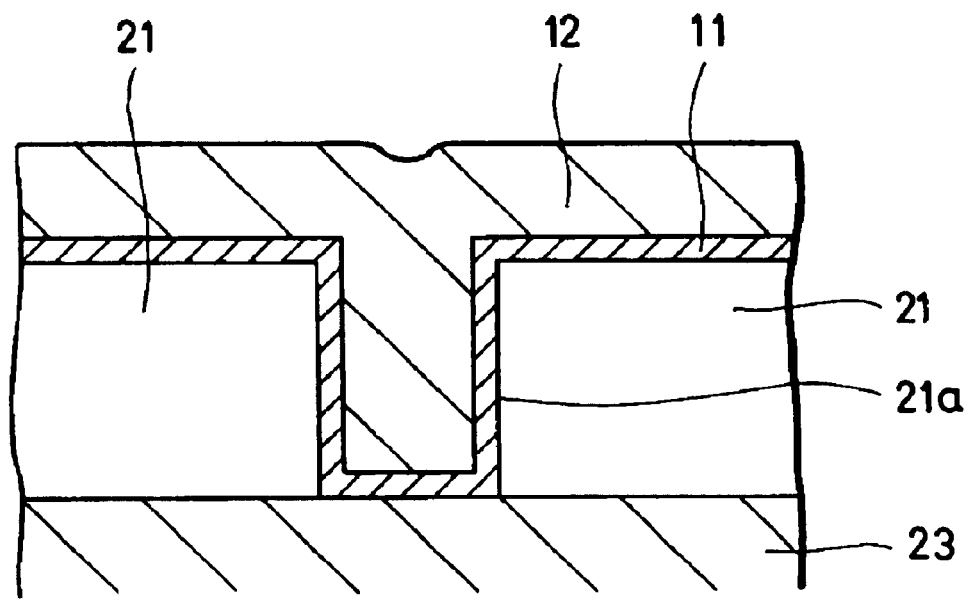
FIGS. 3A and 3B are diagrams showing another embodiment in which the present invention is applied to a method of manufacturing semiconductor devices.
Figure 3B:
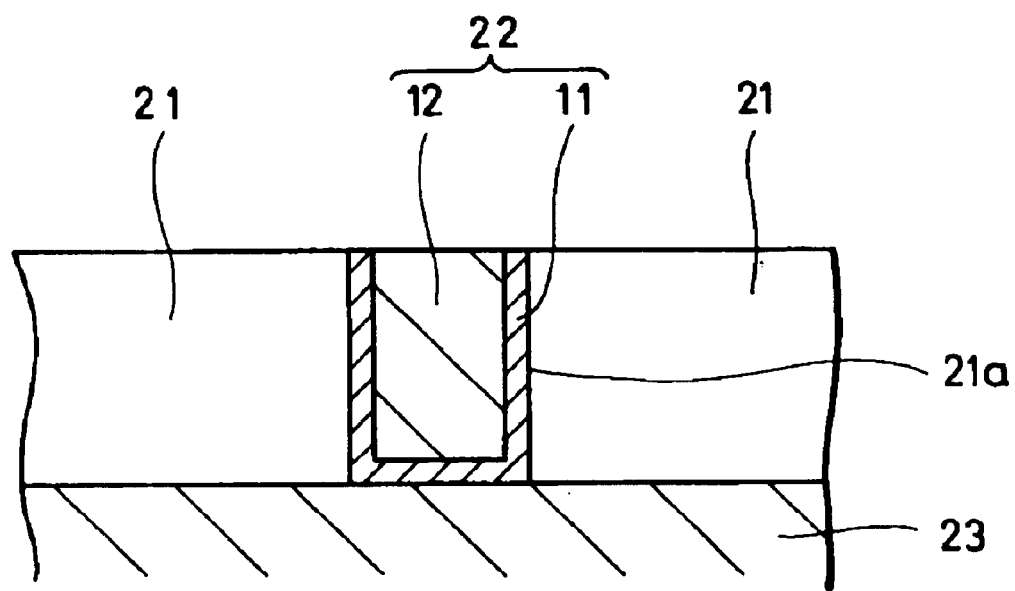

With application of the present invention, as shown in FIG. 3A, a first film 11, which is formed of a film deposited by the sputtering or vapor deposition, is formed on an insulating layer 21 with a contact hole 21a on an underlayer 23. After the surface of the first film 11 is made flat by removing the natural oxide on the surface of the first film 11, the contact hole 21a is buried and a second film 12 is formed on the whole surface by the CVD. Thus, thereafter, as shown in FIG. 3B, the first film 11 and the second film 12 of other portions than the contact hole 21a are removed by etch back without over-etching, thereby resulting in a conductive buried layer 22 being formed.

Then, the second film is formed on the first film by the chemical vapor deposition, whereby the interconnection layer or the contact buried layer comprising the conductive layer is formed with the surface of excellent flatness.

The solid-state imaging device and its manufacturing method and the semiconductor device manufacturing method according to the present invention are not limited to the above-mentioned embodiment, and can take various modifications without departing from the gist of the present invention.

As described above, according to the present invention, in the solid-state imaging device, since the first film having the excellent adhesion and the second film having the excellent step coverage property form the light-shielding film, the satisfactory adhesion between the light-shielding film and the underlayer may be maintained, and the film thickness of the light-shielding film may be made sufficiently thick even in the side wall of the step.

Therefore, without the increase of passing light and the increase of the dark current, it becomes possible to decrease the film thickness of the light-shielding film. Thus, it is possible to prevent a sensitivity from being lowered and also to prevent a smear from being increased as the pixel size is reduced.

Also, according to the present invention, since the film thickness of the light-shielding film is reduced, the accuracy of the microminiaturization process may be improved, thereby making it possible to prevent the image quality from being deteriorated as the sensitivity is fluctuated.

Further, according to the present invention, since the light-shielding film may be reduced in film thickness, the damages caused on the underlayer upon dry etching may be reduced, thereby making it possible to reduce the dark current and to reduce the point defect.

Furthermore, according to the semiconductor device manufacturing method of the present invention, since the first film is formed, the conductive layer with the excellent adhesion with the underlayer may be formed. Also, the natural oxide on the surface of the first film is removed, whereby the surface of the first film may be made flat and the flatness of the surface of the subsequent conductive layer may be made satisfactory.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid-state imaging device, comprising:
   a semiconductor substrate;
   a light-receiving portion formed on said substrate; and
   a light-shielding film formed to cover an electrode formed on said semiconductor substrate on its regions other than a region above said light-receiving portion, said light-shielding film comprising a multilayer structure including a first film formed as an adhesion film and deposited by sputtering or vapor deposition, and a second film deposited by chemical vapor deposition;
   wherein said first film is formed of a tungsten film and said second film is formed of a tungsten film.

2. The solid-state imaging device as set forth in claim 1, wherein said electrode is a transfer electrode formed on the semiconductor substrate at its area other than the area in which the light-receiving portion is formed through a gate insulating film, said light-shielding film formed on the transfer electrode through an interlayer insulating film, said light-shielding film preventing light from becoming incident on the transfer electrode.

3. The solid-state imaging device as set forth in claim 2, further comprising an interlayer insulating film formed over the surface of the light-shielding film, a planarization film formed over the surface of the interlayer insulating film, a color filter formed on the planarization film, and a micro-lens formed on the color filter.

4. The solid-state imaging device as set forth in claim 1 wherein said first film of tungsten has a thickness in a range of 20 to 100 nm, and said second film of tungsten has a thickness in a range of about 80 nm to 200 nm so as to maintain a satisfactory light-shielding property.

5. A solid-state imaging device, which comprises:
   a light-receiving portion formed on a semiconductor substrate; and
   a light-shielding film formed so as to cover an electrode formed on said semiconductor substrate on regions of said semiconductor substrate other than a region above said light-receiving portion;
   wherein said solid-state imaging device is formed such that said light-shielding film has a multilayer structure including a first film formed of a tungsten film deposited by sputtering or vapor deposition and a second film deposited by chemical vapor deposition; and
   the entirety of the light-shielding film is less than 200 nm.

6. A solid-state imaging device, which comprises:
   a light-receiving portion formed on a semiconductor substrate; and
   a light-shielding film formed so as to cover an electrode formed on said semiconductor substrate on regions of said semiconductor substrate other than a region above said light-receiving portion;
   wherein said solid-state imaging device is formed such that said light-shielding film has a multilayer structure including a first film formed of a film deposited by sputtering or vapor deposition and a second film formed of a tungsten film deposited by chemical vapor deposition; and
   the entirety of the light-shielding film is less than 200 nm.

7. A solid-state imaging device according to claim 5, wherein the entirety of the light-shielding film is approximately 100 nm.

8. A solid-state imaging device according to claim 6, wherein the entirety of the light-shielding film is approximately 100 nm.

9. A solid-state imaging device, comprising:
- a light-receiving portion formed on a semiconductor substrate; and
- a light-shielding film formed so as to cover an electrode formed on said semiconductor substrate on its region other than a region above said light-receiving portion;
- wherein said light-shielding film has a multilayer structure including a first film formed of a first material capable of being deposited by sputtering or vapor deposition and a second film formed of a second material capable of being deposited by chemical vapor deposition; and
- both said first film and said second film are formed of tungsten.

10. A solid-state imaging device, comprising:
- a light-receiving portion formed on a semiconductor substrate; and
- a light-shielding film formed so as to cover an electrode formed on said semiconductor substrate on its region other than a region above said light-receiving portion;
- wherein said light-shielding film has a multilayer structure including a first film formed of a first material capable of being deposited by sputtering or vapor deposition and a second film formed of a second material capable of being deposited by chemical vapor deposition; and
- said first film is formed of aluminum, gold, chromium, molybdenum silicide, or tungsten silicide.

* * * * *